(12) United States Patent
Hashiguchi

(10) Patent No.: US 11,470,718 B2
(45) Date of Patent: Oct. 11, 2022

(54) ELECTRICAL CONNECTING ELEMENT

(71) Applicant: JAPAN AVIATION ELECTRONICS INDUSTRY, LIMITED, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 45 days.

(21) Appl. No.: 16/916,775

(22) Filed: Jun. 30, 2020

(65) Prior Publication Data

US 2021/0076490 A1 Mar. 11, 2021

(30) Foreign Application Priority Data

Sep. 10, 2019 (JP) .............................. JP2019-164793

(51) Int. Cl.
| | | |
|---|---|---|
| *H05K 1/02* | (2006.01) | |
| *D02G 3/32* | (2006.01) | |
| *H01B 3/48* | (2006.01) | |
| *H01B 13/008* | (2006.01) | |
| *D04B 1/18* | (2006.01) | |

(52) U.S. Cl.
CPC ............. *H05K 1/0283* (2013.01); *D02G 3/32* (2013.01); *D04B 1/18* (2013.01); *H01B 3/48* (2013.01); *H01B 13/008* (2013.01)

(58) Field of Classification Search
CPC ...... H05K 1/0283; H05K 3/103; H05K 1/189; H05K 1/038; H05K 2201/0281; D02G 3/32; D04B 1/18; H01B 3/48; H01B 13/008; H01B 7/0846
See application file for complete search history.

(56) References Cited

U.S. PATENT DOCUMENTS

| | | | | |
|---|---|---|---|---|
| 2011/0130060 A1* | 6/2011 | Chung | ...................... | D02G 3/36 139/420 R |
| 2011/0272181 A1* | 11/2011 | Koo | ...................... | H05K 1/0219 174/254 |
| 2015/0289364 A1* | 10/2015 | Ilkko | ...................... | H05K 1/0277 174/254 |
| 2019/0306972 A1* | 10/2019 | Baba | ...................... | H05K 1/162 |
| 2019/0306973 A1* | 10/2019 | Baba | ...................... | H05K 1/038 |
| 2020/0203036 A1* | 6/2020 | Mizuno | ............... | B60R 16/0207 |

FOREIGN PATENT DOCUMENTS

JP 2018-116786 A 7/2018

OTHER PUBLICATIONS

Tony Rogers, Everything You Need to Know About Polyehtyelen (PE), Sep. 14, 2015 (Year: 2015).*

* cited by examiner

*Primary Examiner* — Steven T Sawyer
(74) *Attorney, Agent, or Firm* — Greenblum & Bernstein, P.L.C.

(57) ABSTRACT

An electrical connecting element includes a stretchable insulation sheet, two or more first conductive threads on one surface of the insulation sheet, and two or more first resin threads on the one surface of the insulation sheet. The first conductive threads extend in a predetermined direction and are disposed in parallel with each other orthogonally to the predetermined direction. The first resin threads have thermal adhesiveness. The first resin threads do not overlap with any of the first conductive threads.

1 Claim, 10 Drawing Sheets

FIG. 3A
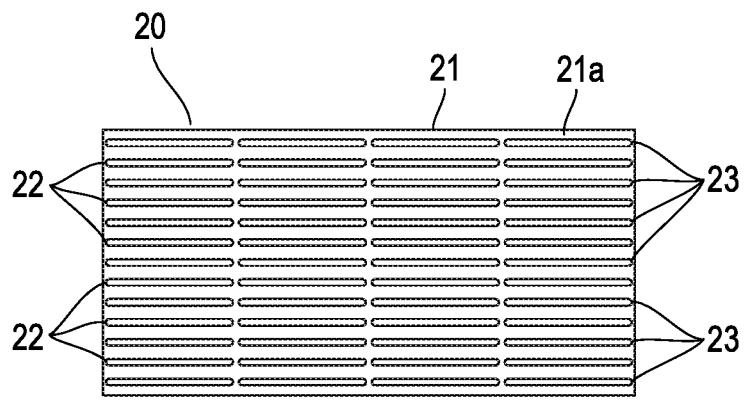
FIG. 3B
FIG. 3C
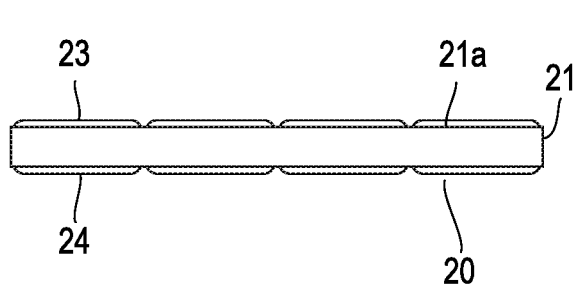 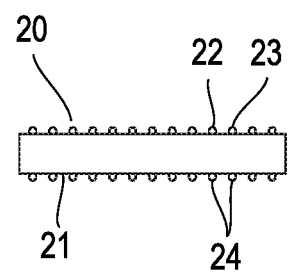
FIG. 3D
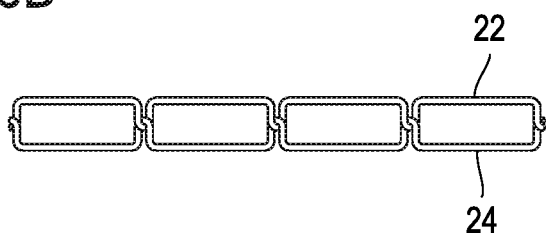
FIG. 3E
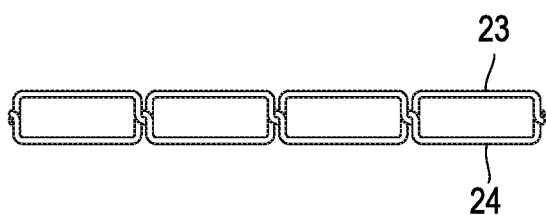

ELECTRICAL CONNECTING ELEMENT

TECHNICAL FIELD

The present invention relates to an electrical connecting element.

BACKGROUND ART

In recent years, stretchable electronics including sensors and stretchable wiring has been developed. For example, stretchable electronics can be utilized as a wearable device that obtains biological information such as the motion or pulsation of the wearer by applying stretchable electronics to clothes.

Japanese Patent Application Laid Open No. 2018-116786 (hereinafter referred to as Patent Literature 1) discloses stretch wiring that can be used for stretchable electronics. FIGS. 1 and 2 illustrate the structure of the stretch wiring disclosed in Patent Literature 1.

Stretch wiring 10 includes: an insulation sheet 11 having stretchiness; two or more conductive threads 12, fixed to the insulation sheet 11, that are spaced apart in parallel with each other; two or more nonconductive threads 13 fixed to the insulation sheet 11 between the adjacent conductive threads 12 (each of the nonconductive threads 13 is woven into the adjacent conductive threads 12); and a covering sheet 14 that covers the conductive threads 12 and the nonconductive threads 13.

The conductive threads 12 extend in one direction while meandering in the planar direction and the thickness direction of the insulation sheet 11. The conductive threads 12 are separated from the insulation sheet 11 in the portion in which the nonconductive threads 13 are present between the conductive threads 12 and the insulation sheet 11. The conductive threads 12 adhere to the insulation sheet 11 in the portion in which the nonconductive threads 13 are not present between the conductive threads 12 and the insulation sheet 11. Since the conductive threads 12 have portions that adhere to the insulation sheet 11 and portions that do not adhere to the insulation sheet 11, a meandering shape can be easily kept, thereby improving the stretchiness and bendability of the stretch wiring 10.

The stretch wiring 10 is suitable for the wiring used for stretchable electronics, more specifically, the wiring attached to, for example, clothes. With regard to the connection between the stretch wiring 10 and the sensor, however, Patent Literature 1 describes only that the stretch wiring 10 is connected to a sensor and does not disclose a specific connection form thereof.

For example, when a sensor is formed as printed electronics in clothes, the sensor may be connected to the stretch wiring by sewing them with conductive threads. However, a connection by sewing is labor intensive and the reliability may become insufficient.

BRIEF SUMMARY OF THE INVENTION

An object of the present invention is to provide an electrical connecting element that is suitable for stretch wiring, has excellent reliability, and is attachable to stretch wiring easily.

The following technical matters in this section are described simply to facilitate the understanding of the main points of the present invention, not to limit the invention claimed in the claims explicitly or implicitly and not to express the possibility of accepting such a limitation that is imposed by a person other than those who will benefit from the present invention (for example, the applicant and the right holder). The general outline of the present invention described from other perspectives can be understood from, for example, the claims of this application as originally filed at the time of application.

An electrical connecting element according to the present invention includes an insulation sheet having stretchiness, and solid resin and two or more conductive threads on one surface of the insulation sheet. The resin is, for example, threadlike synthetic resin having thermal adhesiveness or thin plate-like synthetic resin having thermoplasticity.

A mechanical connection between the electrical connecting element and a target object with wiring is achieved by solidifying resin melted by heating the electrical connecting element with the electrical connecting element pressed against the target object. Since the conductive threads of the electrical connecting element make contact with the wiring of the target object in this state, an electrical connection between the electrical connecting element and the target object is achieved.

These and other objects, features and advantages of the present invention will become apparent from the detailed description taken in conjunction with the accompanying drawings.

Effects of the Invention

This electrical connecting element is suitable for stretch wiring, has excellent reliability, and is attachable to stretch wiring easily.

BRIEF DESCRIPTION OF THE DRAWINGS

The subject matter, which is regarded as the invention, is particularly pointed out and distinctly claimed in the claims at the conclusion of the specification. The present invention itself, and manner in which it may be made or used, if any, may be better understood after a review of the following description in connection with the accompanying drawings in which:

FIG. 3A is a plan view illustrating an electrical connecting element according to a first embodiment;

FIG. 3B is a front view illustrating the electrical connecting element according to the first embodiment;

FIG. 3C is a side view illustrating the electrical connecting element according to the first embodiment;

FIG. 3D is a diagram used to describe the state of the conductive threads sewn to an insulation sheet;

FIG. 3E is a diagram used to describe the state of resin threads sewn to the insulation sheet;

LIST OF REFERENCE NUMERALS

Figure 1:
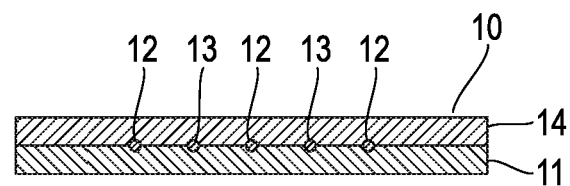
FIG. 1 is a schematic cross sectional view illustrating prior art of stretch wiring.
Figure 2:
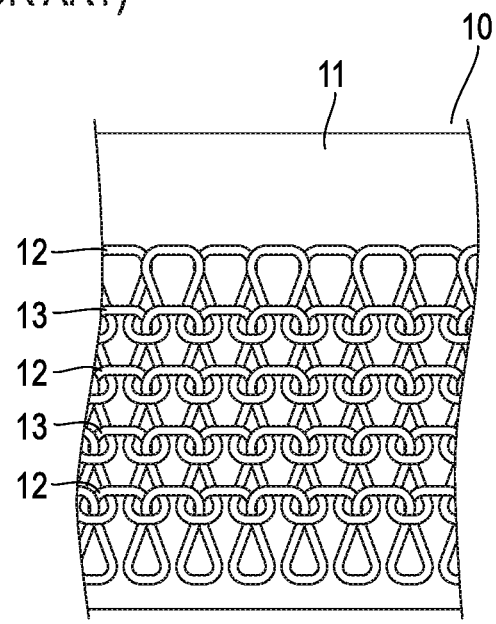
FIG. 2 is a schematic plan view illustrating the disposition state of conductive threads and nonconductive threads of the stretch wiring illustrated in FIG. 1.

With regard to reference numerals used, the following numbering is used throughout the drawings.
10: stretch wiring
11: insulation sheet
12: conductive thread
13: nonconductive thread
14: covering sheet
20: electrical connecting element
21: insulation sheet
21a: one surface
21b: the other surface
22: conductive thread
23: resin thread
24: thread
25: adhesive layer
30: fabric wiring
40: sensor
41: connection portion
50, 60, 70, 80: electrical connecting element
51, 71: composite sheet
81: insulation sheet
82: warp yarn
83: weft yarn

DETAILED DESCRIPTION

Electrical connecting elements according to embodiments of the present invention will be described with reference to the drawings. In the following description, the term "wiring" means an object, not an act unless otherwise described or unless uniquely understood from the context.

First Embodiment

FIGS. 3A to 3E illustrate the structure of an electrical connecting element according to a first embodiment. An electrical connecting element 20 in this example has the structure in which two or more conductive threads 22 and two or more resin threads 23 having thermal adhesiveness are sewn to a stretchable insulation sheet 21 by a sewing machine.

The conductive threads 22 are sewn in the longitudinal direction of the rectangular insulation sheet 21 across the whole length of the insulation sheet 21. The conductive threads 22 are disposed in parallel with each other at a predetermined pitch in the width direction of the insulation sheet 21.

The resin threads 23 are sewn to the insulation sheet 21 on one surface 21a of the insulation sheet 21 without overlapping with any of the conductive threads 22 and both the conductive threads 22 and the resin threads 23 are present on one surface 21a of the insulation sheet 21. In this example, the resin threads 23 are sewn in the longitudinal direction of the insulation sheet 21 across the whole length of the insulation sheet 21. The resin threads 23 are disposed in parallel with each other at a predetermined pitch in the width direction of the insulation sheet 21. The conductive threads 22 and the resin threads 23 are disposed alternately.

The structural material of the insulation sheet 21 is, for example, fabric of natural fiber or chemical fiber, or elastomer such as synthetic resin or rubber. In particular, the structural material of the insulation sheet 21 is preferably polyurethane, which is synthetic resin having excellent stretchiness.

The conductive threads 22 are, for example, conductive threads of metal, conductive threads of a carbon compound, or plated threads obtained by plating insulation fiber with metal or alloy. In particular, the conductive threads 22 are preferably stretchable plated threads having excellent durability. The metal used for plated threads is preferably gold or silver with a low electrical resistance. The conductive threads 22 may be a solid wire or a stranded wire in which solid wires are stranded each other.

The resin threads 23 having thermal adhesiveness are, for example, nylon threads.

When the conductive threads 22 are sewn with a sewing machine, upper threads and lower threads are set in the sewing machine so that the conductive threads 22 are located on one surface 21a of the insulation sheet 21. For example, when one surface 21a is the front side of the electrical connecting element 20 and the electrical connecting element 20 is placed on the needle plate (generally, the needle plate is a metal plate located above the space that houses a bobbin around which the lower threads are wound) of the sewing machine with one surface 21a facing upward, the conductive threads 22 are set as the upper threads in the sewing machine. In this case, the lower threads do not need to have conductivity or adhesiveness and are threads 24 of natural fiber or chemical fiber in this example (see FIG. 3D). FIG. 3D illustrates a lockstitch including the conductive threads 22 and the threads 24. Alternatively, when the electrical connecting element 20 is placed on the needle plate of the sewing machine with one surface 21a facing downward, the conductive threads 22 are set as the lower threads in the sewing machine. In this case, the upper threads do not need to have conductivity or adhesiveness and are threads of, for example, natural fiber or chemical fiber.

Similarly, when the resin threads 23 are sewn with the sewing machine, the upper threads and the lower threads are set in the sewing machine so that the resin threads 23 are located on one surface 21a of the insulation sheet 21. For example, when the electrical connecting element 20 is placed on the needle plate of the sewing machine with one surface 21a facing upward, the resin threads 23 are set as the upper threads in the sewing machine. In this case, the lower threads do not need to have conductivity or adhesiveness and are the threads 24 of natural fiber or chemical fiber in this example (see FIG. 3E). FIG. 3E illustrates a lockstitch including the resin threads 23 and the threads 24. Alternatively, when the electrical connecting element 20 is placed on the needle plate of the sewing machine with one surface 21a facing downward, the resin threads 23 are set as the lower threads in the sewing machine. In this case, the upper threads do not need to have conductivity or adhesiveness and are threads of, for example, natural fiber or chemical fiber.

Furthermore, two needles may be used for the sewing machine instead of one. For example, when the electrical connecting element 20 is placed on the needle plate of the sewing machine with one surface 21a facing upward, the conductive threads 22 are set as the upper threads for one of the two needles and the resin threads 23 are set as the upper threads for the other of the two needles in the sewing machine. In this case, the lower threads do not need to have conductivity or adhesiveness and are the threads 24 of natural fiber or chemical fiber in this example.

Figure 4:
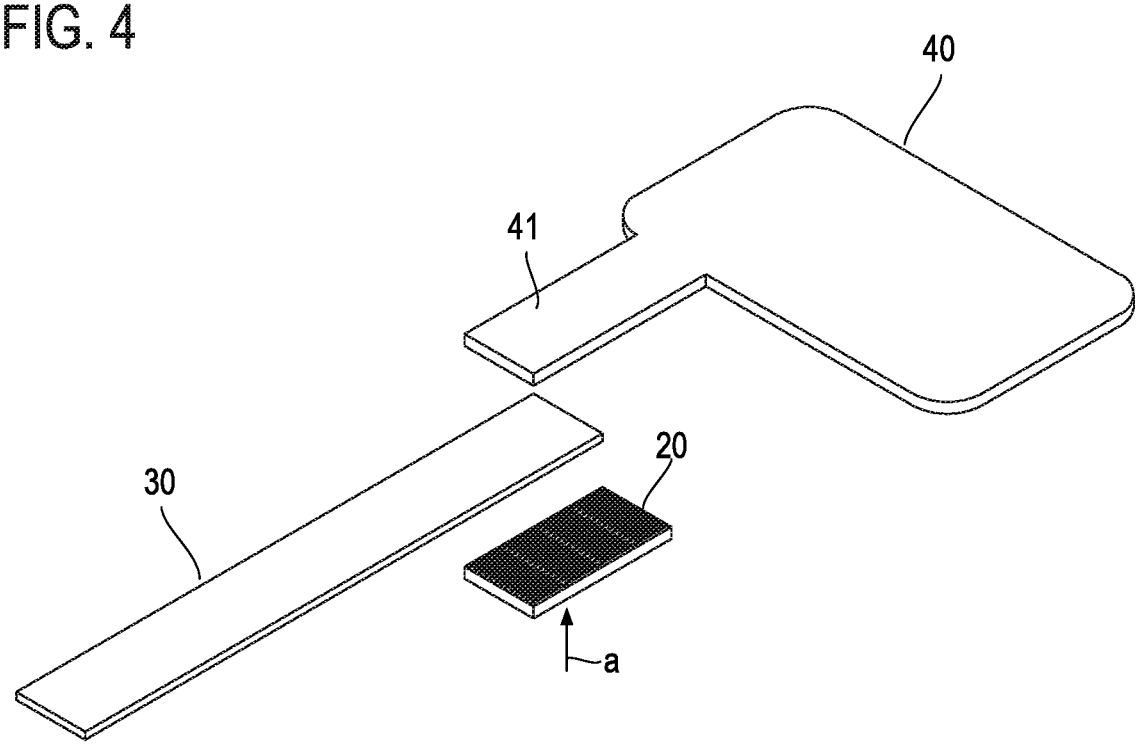
FIG. 4 is a diagram used to describe the connection between fabric wiring and a sensor via the electrical connecting element according to the first embodiment.

FIG. 4 illustrates how fabric wiring 30 and a sensor 40 are connected to each other via the electrical connecting element 20 as a usage example of the electrical connecting element 20. The fabric wiring 30 is the stretch wiring included in a wearable device and formed by conductive threads (silver threads in this example). The sensor 40 (or may be referred to as the transducer) is a planar electrode formed as printed electronics for detecting pulsation or a muscle potential. The details of the fabric wiring 30 are not illustrated.

The fabric wiring 30 and the sensor 40 are connected to each other by aligning the end portion of the fabric wiring 30, a connection portion 41 of the sensor 40, and the electrical connecting element 20 with each other as illustrated in FIG. 4, and heating the electrical connecting element 20 while pressing the electrical connecting element 20 against the fabric wiring 30 and the sensor 40 in the state in which the electrical connecting element 20 straddles the fabric wiring 30 and the sensor 40. The heating means for heating the electrical connecting element 20 is, for example, an iron. In FIG. 4, symbol a represents the direction in which the iron is pressed against the electrical connecting element 20.

Figure 5:
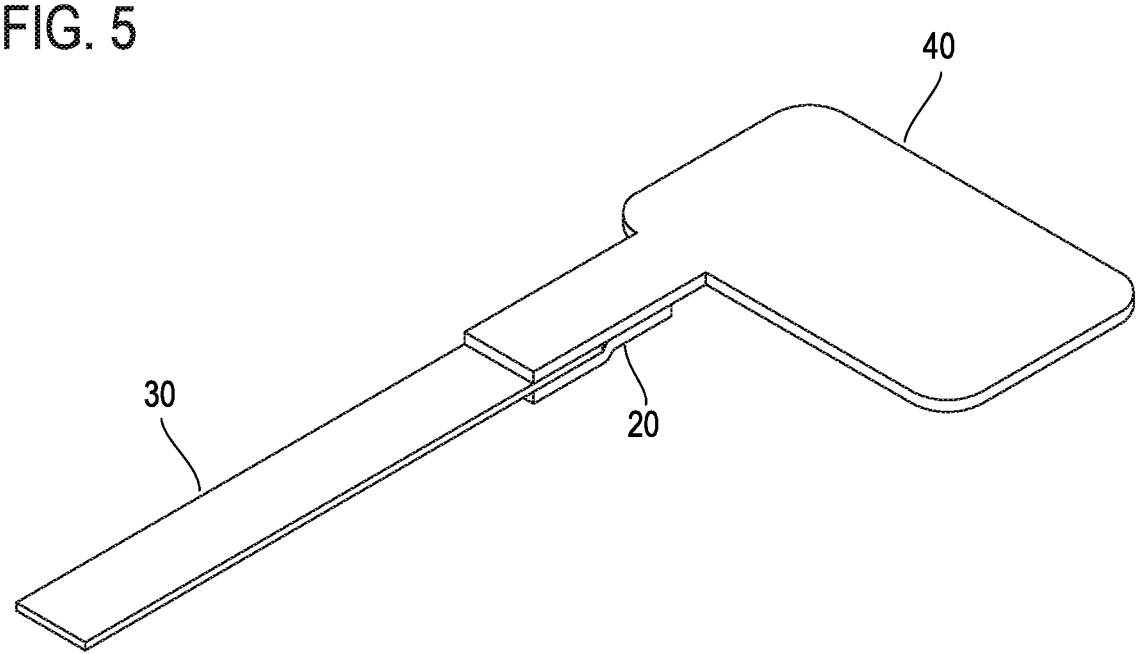
FIG. 5 illustrates the state in which the fabric wiring and the sensor have been connected to each other via the electrical connecting element according to the first embodiment.
Figure 6A:
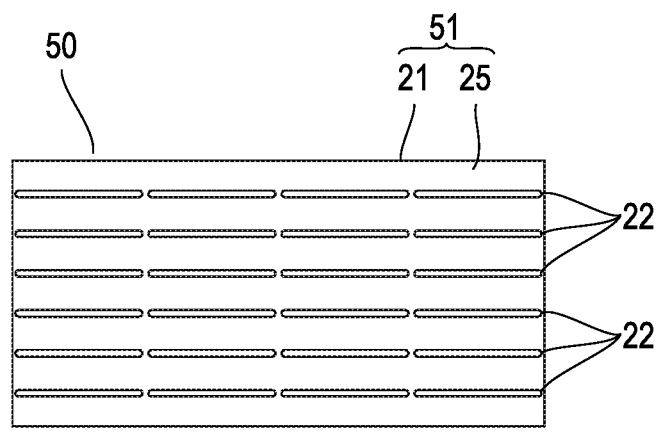
FIG. 6A is a plan view illustrating an electrical connecting element according to a second embodiment.
Figure 6B:
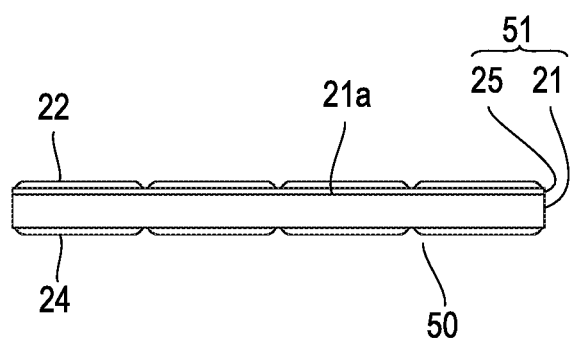
FIG. 6B is a front view illustrating the electrical connecting element according to the second embodiment.
Figure 6C:
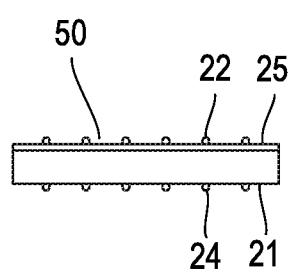
FIG. 6C is a side view illustrating the electrical connecting element according to the second embodiment.
Figure 6D:
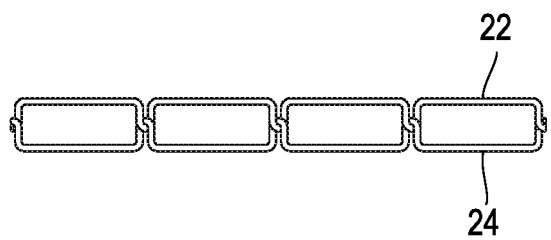
FIG. 6D is a diagram used to describe the state of the conductive threads sewn to a composite sheet.

FIG. 5 illustrates the state in which the fabric wiring 30 and the sensor 40 have been connected to each other via the electrical connecting element 20. The electrical connecting element 20 adheres to the fabric wiring 30 and the connection portion 41 by solidifying the resin threads 23 melted by heating. In this state, the fabric wiring 30 and the sensor 40 are electrically connected to each other via the conductive threads 22. Accordingly, a mechanical connection and an electrical connection between the fabric wiring 30 and the connection portion 41 are achieved by the electrical connecting element 20.

In the electrical connecting element 20, electrical and mechanical connections between two members to be connected to each other can be achieved very easily by heating and pressurization by an iron or the like.

Since the conductive threads 22 and the resin threads 23 are sewn to the stretchable insulation sheet 21 via a lockstitch (see FIGS. 3D and 3E), the conductive threads 22 and the resin threads 23 can follow the expansion and contraction of the insulation sheet 21. Therefore, the electrical connecting element 20 is suitable for the electrical connecting element of a wearable device that needs to have stretchiness and bendability.

Other embodiments of the electrical connecting element will be described below. The same components as in the first embodiment are denoted by the same reference characters to omit detailed descriptions thereof.

Second Embodiment

FIGS. 6A to 6E illustrate the structure of an electrical connecting element according to a second embodiment. An electrical connecting element 50 is different from the electrical connecting element 20 according to the first embodiment in that the electrical connecting element 50 does not have the resin threads 23 with thermal adhesiveness and includes a thermoplastic adhesive layer 25 with stretchiness formed on one surface 21a of the insulation sheet 21.

The conductive threads 22 are sewn to a composite sheet 51 including the insulation sheet 21 and the adhesive layer 25, in the same manner as in the first embodiment. That is, the conductive threads 22 are sewn in the longitudinal direction of the rectangular composite sheet 51 across the whole length of the composite sheet 51. The conductive threads 22 are located on the adhesive layer 25. The conductive threads 22 are disposed in parallel with each other at a predetermined pitch in the width direction of the composite sheet 51. In this example, when the conductive threads 22 are sewn with a sewing machine, the conductive threads 22 are set as the upper threads in the sewing machine and the normal threads 24 are set as the lower threads (see FIG. 6D).

The structural material of the thermoplastic adhesive layer 25 with stretchiness is, for example, polyolefin resin. In consideration of the sewing of the conductive threads 22 to the composite sheet 51 with a sewing machine, the adhesive layer 25 preferably does not have adhesiveness at room temperature. That is, the adhesive layer 25 has adhesiveness when the adhesive layer 25 is heated.

Figure 7:
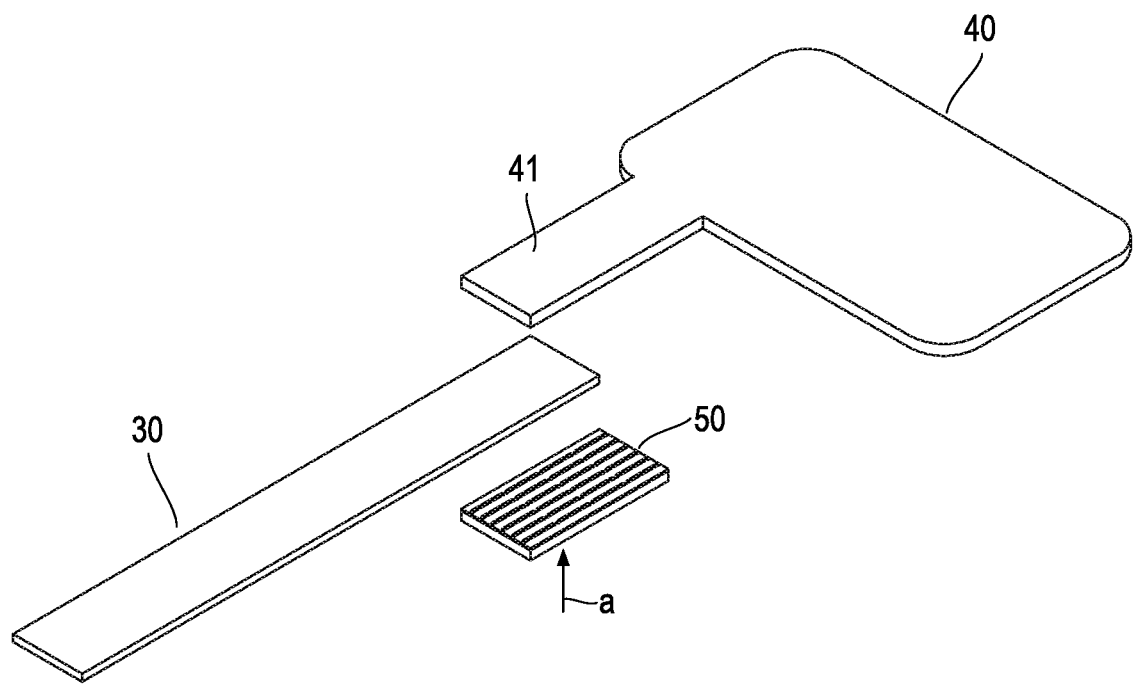
FIG. 7 is a diagram used to describe the connection between the fabric wiring and the sensor via the electrical connecting element according to the second embodiment.
Figure 8:
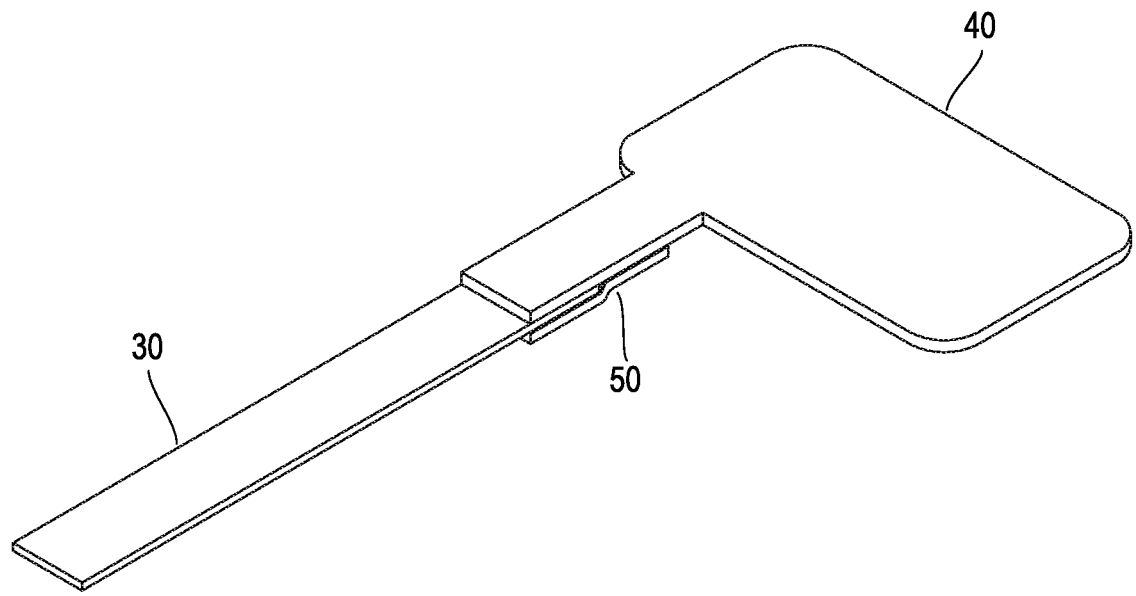
FIG. 8 illustrates the state in which the fabric wiring and the sensor have been connected to each other via the electrical connecting element according to the second embodiment.
Figure 9A:
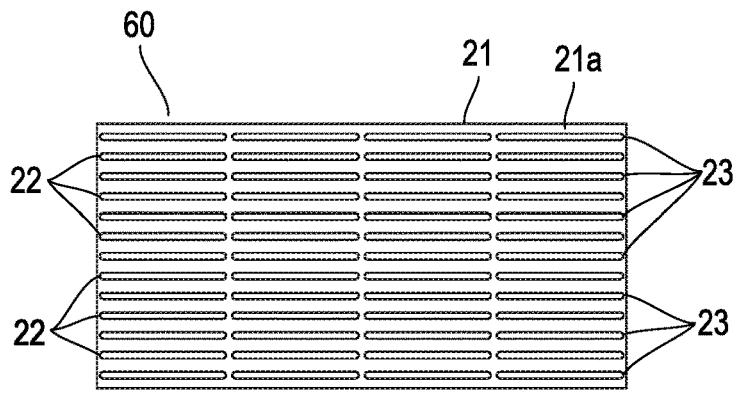
FIG. 9A is a plan view illustrating an electrical connecting element according to a third embodiment.
Figure 9B:
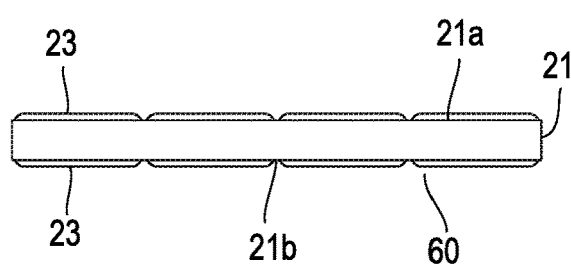
FIG. 9B is a front view illustrating the electrical connecting element according to the third embodiment.
Figure 9C:
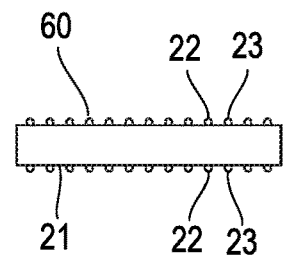
FIG. 9C is a side view illustrating the electrical connecting element according to the third embodiment.
Figure 9D:
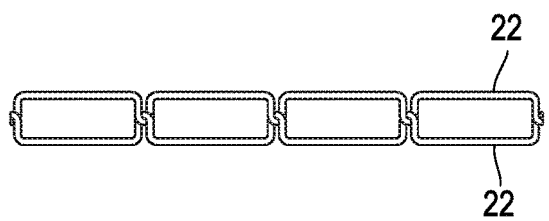
FIG. 9D is a diagram used to describe the state of the conductive threads sewn to the insulation sheet.
Figure 9E:
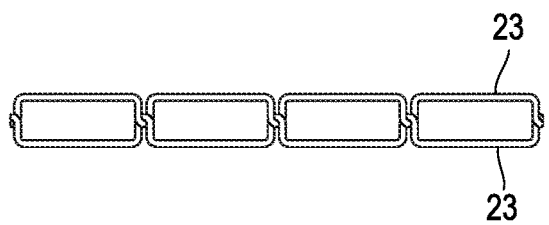
FIG. 9E is a diagram used to describe the state of the resin threads sewn to the insulation sheet.

FIG. 7 illustrates how the fabric wiring 30 and the sensor 40 are connected to each other via the electrical connecting element 50 and FIG. 8 illustrates the state in which the fabric wiring 30 and the sensor 40 have been connected to each other via the electrical connecting element 50. As in the first embodiment, a mechanical connection and an electrical connection between the fabric wiring 30 and the connection portion 41 of the sensor 40 are achieved by aligning the end portion of the fabric wiring 30, the connection portion 41, and the electrical connecting element 50 with each other and heating the electrical connecting element 50 while pressing the electrical connecting element 50 against the fabric wiring 30 and the sensor 40 in the state in which the electrical connecting element 50 straddles the fabric wiring 30 and the sensor 40.

Third Embodiment

FIG. 9 illustrates the structure of an electrical connecting element according to a third embodiment. An electrical connecting element 60 is different from the electrical connecting element 20 according to the first embodiment in that the conductive threads 22 are set as the upper threads and the lower threads in the sewing machine as illustrated in FIG. 9D when the conductive threads 22 are sewn with the sewing machine, and the resin threads 23 are set as the upper threads and the lower threads in the sewing machine as illustrated in FIG. 9E when the resin threads 23 are sewn with the sewing machine.

The conductive threads 22 as the upper threads are located on, for example, one surface 21*a* of the insulation sheet 21 and the conductive threads 22 as the lower threads are located on, for example, the other surface 21*b* of the insulation sheet 21. In this example, the conductive threads 22 as upper threads and the conductive threads 22 as lower threads are electrically connected to each other because of a lockstitch (see FIG. 9D). Accordingly, the electrical connecting element 60 can make an electrical connection and a mechanical connection between two members (fabric wiring 30 and sensor 40 in this example) in the thickness direction of the electrical connecting element 60. That is, the electrical connecting element 60 can be used to connect one surface of one member to one surface of the other member that faces one surface of one member.

Figure 10:
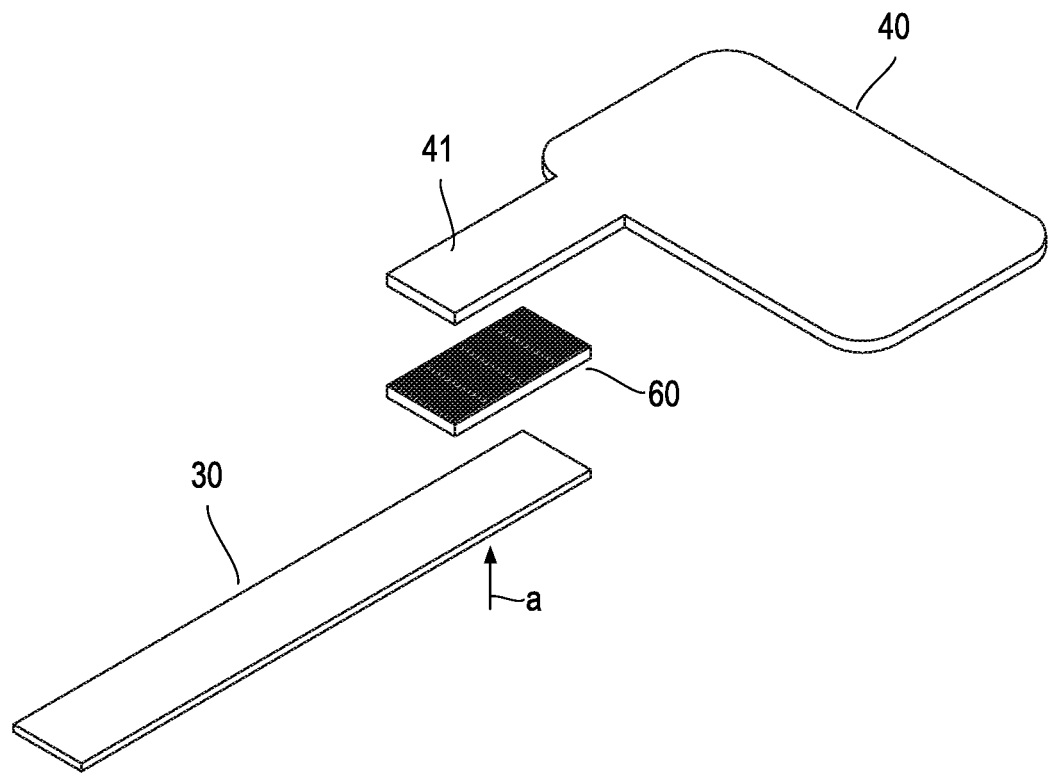
FIG. 10 is a diagram used to describe the connection between the fabric wiring and the sensor via the electrical connecting element according to the third embodiment.
Figure 11:
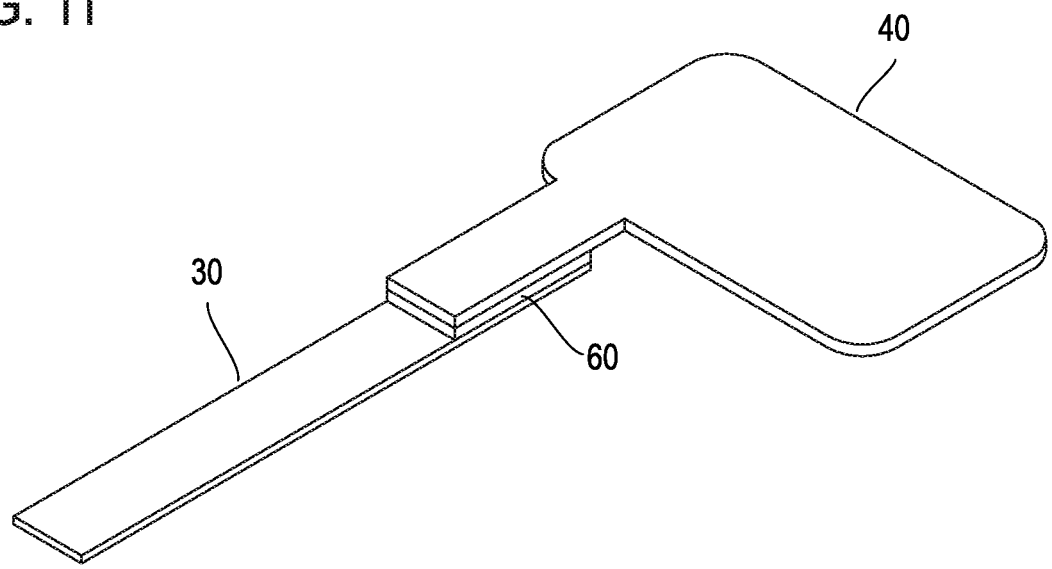
FIG. 11 illustrates the state in which the fabric wiring and the sensor have been connected to each other via the electrical connecting element according to the third embodiment.
Figure 12A:
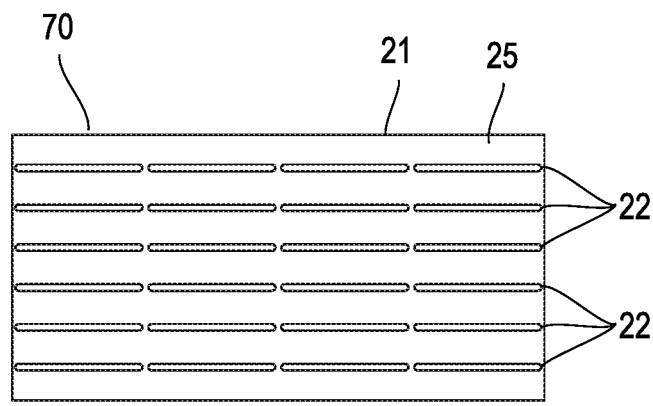
FIG. 12A is a plan view illustrating an electrical connecting element according to a fourth embodiment.
Figure 12B:
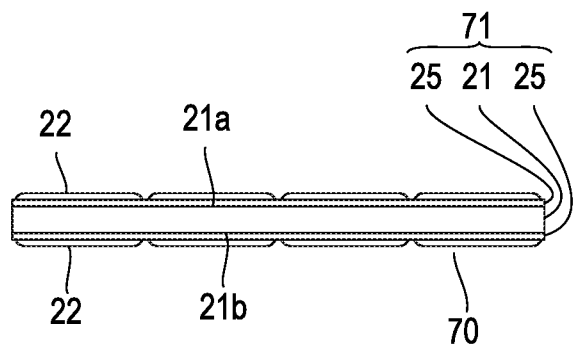
FIG. 12B is a front view illustrating the electrical connecting element according to the fourth embodiment.
Figure 12C:
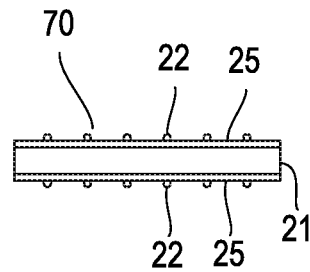
FIG. 12C is a side view illustrating the electrical connecting element according to the fourth embodiment.
Figure 12D:
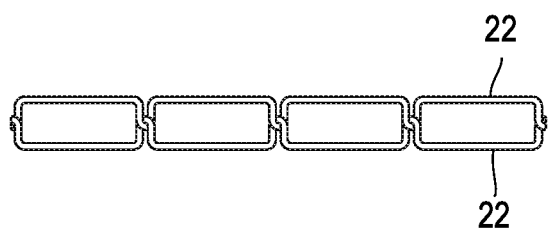
FIG. 12D is a diagram used to describe the state of the conductive threads sewn to the composite sheet.

FIG. 10 illustrates how the fabric wiring 30 and the sensor 40 are connected to each other via the electrical connecting element 60 and FIG. 11 illustrates the state in which the fabric wiring 30 and the sensor 40 have been connected to each other via the electrical connecting element 60. A mechanical connection and an electrical connection between the fabric wiring 30 and the connection portion 41 of the sensor 40 are achieved by heating the electrical connecting element 60 while pressing, for example, an iron in the arrow direction (see symbol a) against the fabric wiring 30 in the state in which the electrical connecting element 60 is sandwiched between the end portion of the fabric wiring 30 and the connection portion 41. The direction in which the iron is pressed is not limited to the arrow direction (see symbol a) and the iron may be pressed against the connection portion 41 in the direction opposite to the arrow direction in FIG. 10.

The fabric wiring 30 and the connection portion 41 are mechanically connected to each other by causing the resin threads 23 located on both surfaces 21*a* and 21*b* of the insulation sheet 21 to adhere to the fabric wiring 30 and the connection portion 41 through melting and solidifying processes. The fabric wiring 30 and the sensor 40 are electrically connected to each other via the conductive threads 22 as the upper threads and the conductive threads 22 as the lower threads in contact with each other.

Fourth Embodiment

FIG. 12 illustrates the structure of an electrical connecting element according to a fourth embodiment. An electrical connecting element 70 is different from the electrical connecting element 20 according to the first embodiment in that the electrical connecting element 70 does not have the resin threads 23 with thermal adhesiveness and includes the thermoplastic adhesive layers 25 with stretchiness formed on one surface 21*a* and the other surface 21*b* of the insulation sheet 21.

The conductive threads 22 are sewn to a composite sheet 71 including the insulation sheet 21 and the two adhesive layers 25, in the same manner as in the first embodiment. The conductive threads 22 are located on one of the adhesive layers 25 and the conductive threads 22 are also located on the other of the adhesive layers 25. In this example, when the conductive threads 22 are sewn with a sewing machine, the conductive threads 22 are set as upper threads and lower threads in the sewing machine (see FIG. 12D).

The electrical connecting element 70 can make an electrical connection and a mechanical connection between two members (fabric wiring 30 and sensor 40 in this example) in the thickness direction of the electrical connecting element 60, as the electrical connecting element 60 according to the third embodiment.

Figure 13:
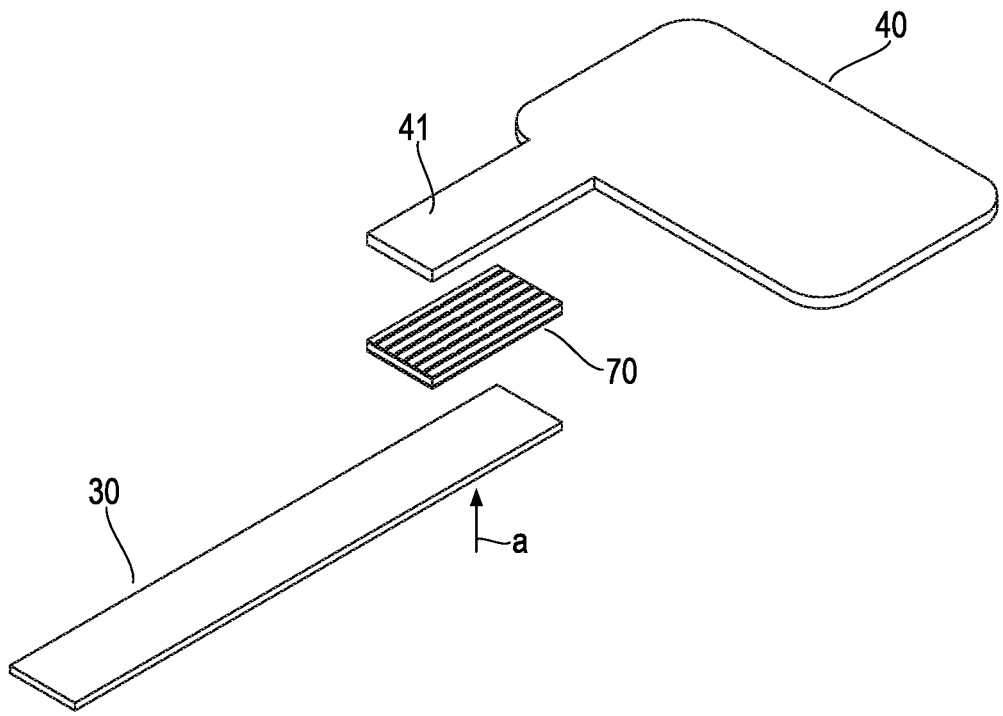
FIG. 13 is a diagram used to describe the connection between the fabric wiring and the sensor via the electrical connecting element according to the fourth embodiment.
Figure 14:
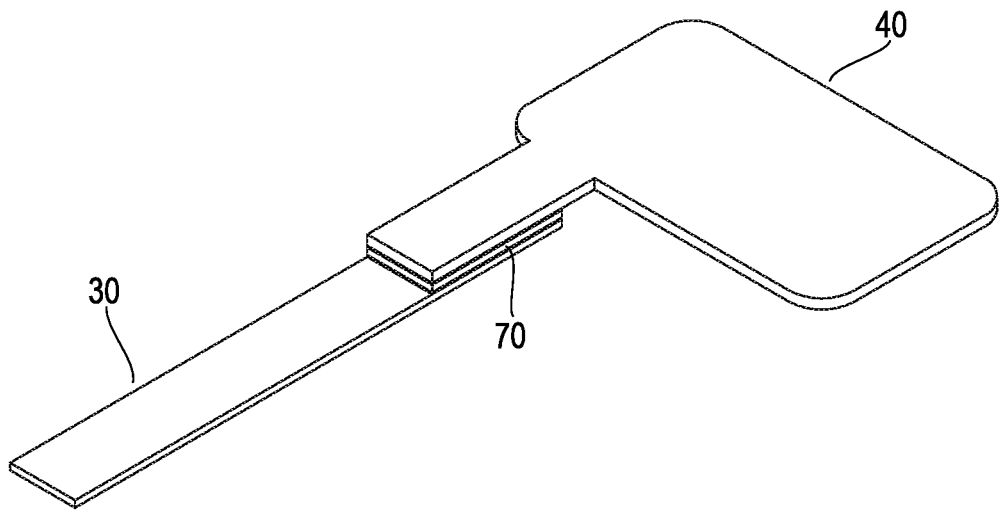
FIG. 14 illustrates the state in which the fabric wiring and the sensor have been connected to each other via the electrical connecting element according to the fourth embodiment.

FIG. 13 illustrates how the fabric wiring 30 and the sensor 40 are connected to each other via the electrical connecting element 70 and FIG. 14 illustrates the state in which the fabric wiring 30 and the sensor 40 have been connected to each other via the electrical connecting element 70. As in the third embodiment, a mechanical connection and an electrical connection between the fabric wiring 30 and the connection portion 41 of the sensor 40 are achieved by heating the electrical connecting element 70 while pressing, for example, an iron in the arrow direction (see symbol a) against the fabric wiring 30 in the state in which the electrical connecting element 70 is sandwiched between the end portion of the fabric wiring 30 and the connection portion 41. The direction in which the iron is pressed is not limited to the arrow direction (see symbol a) and the iron may be pressed against the connection portion 41 in the direction opposite to the arrow direction in FIG. 13.

Fifth Embodiment

Figure 15:
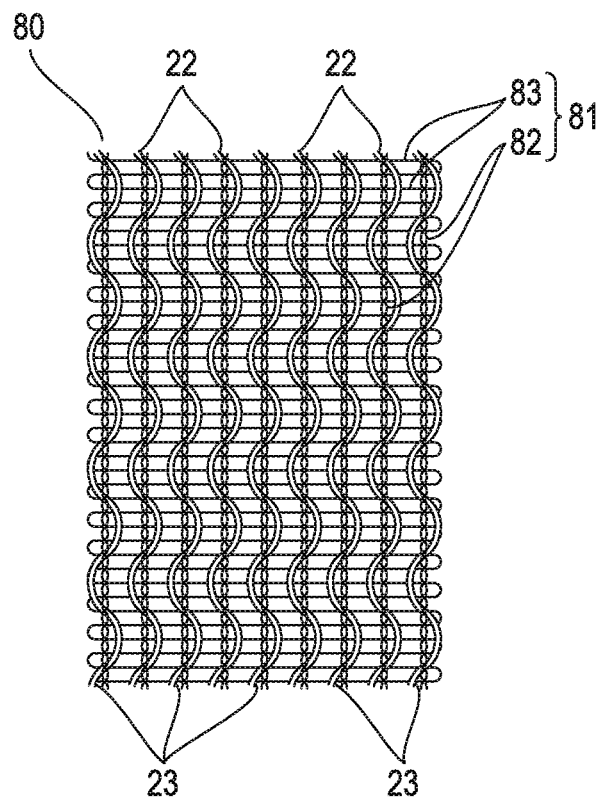
FIG. 15 is a plan view illustrating an electrical connecting element according to a fifth embodiment.

FIG. 15 schematically illustrates the structure of an electrical connecting element according to a fifth embodiment. An insulation sheet 81 of an electrical connecting element 80 is warp-woven fabric including warp yarn 82 and weft yarn 83. The conductive threads 22 are woven into this fabric in a wavelike manner and the resin threads 23 are also woven into this fabric in a wavelike manner.

The conductive threads 22 and the resin threads 23 are woven into the rectangular insulation sheet 81 in parallel with each other in the warp yarn direction of the insulation sheet 81. The conductive threads 22 and the resin threads 23 are alternately disposed in the weft yarn direction of the insulation sheet 81.

The warp yarn 82 and the weft yarn 83 are each yarn of natural fibers or chemical fibers and, for example, polyester yarn or the like.

Figure 16:
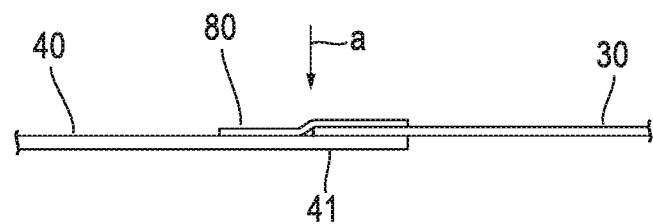
FIG. 16 illustrates the main part of the fabric wiring and the sensor connected to each other via the electrical connecting element according to the fifth embodiment.

FIG. 16 illustrates the main part of the fabric wiring 30 and the sensor 40 connected to each other via the electrical connecting element 80. As in the first embodiment, a mechanical connection and an electrical connection between the fabric wiring 30 and the connection portion 41 of the sensor 40 are achieved by aligning the end portion of the fabric wiring 30, the connection portion 41, and the electrical connecting element 80 with each other and then heating the electrical connecting element 80 while pressing the electrical connecting element 80 against the fabric wiring 30 and the sensor 40 in the state in which the electrical connecting element 80 straddles the fabric wiring 30 and the sensor 40.

As the electrical connecting element 20, the above-described electrical connecting elements 50, 60, 70, and 80 are suitable for electrical connecting elements for wearable devices and electrical and mechanical connections between two members to be connected to each other can be achieved very easily by heating and pressurization by an iron or the like.

Addendum

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims.

Moreover, the use of the terms "first", "second", "i-th", etc., if any, do not denote any order or importance, but rather the terms "first", "second", "i-th", etc. are used to distinguish one element from another. The term "first" does not necessarily mean "coming before all others in order". The terminology used herein is for the purpose of describing particular embodiments only and is not intended to limit the invention in any way. As used herein, the singular forms "a", "an" and "the" are intended to include the plural forms as well, unless the context clearly indicates otherwise. It will be further understood that the terms "comprise", "comprises", and/or "comprising," when used in this specification and/or the appended claims, specify the presence of stated features, steps, operations, elements, and/or components, but do not preclude the presence or addition of one or more other features, steps, operations, elements, components, and/or groups thereof. The same goes for "include", "includes", and/or "including". The term "and/or", if any, includes any and all combinations of one or more of the associated listed items. In the claims and the specification, unless otherwise noted, "connect", "join", "couple", "interlock", or synonyms therefor and all the word forms thereof, if any, do not necessarily deny the presence of one or more intermediate elements between two elements, for instance, two elements "connected" or "joined" to each other or "interlocked" with each other. Connection between elements, if required, may be physical connection, electrical connection, or a combination thereof.

Unless otherwise defined, all terms (including technical and scientific terms) used herein have the same meaning as commonly understood by those skilled in the art to which the invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual techniques or steps in an unnecessary fashion. Nevertheless, the specification and claims should be read with the understanding that such combinations are entirely within the scope of the invention and the claims.

The corresponding structures, materials, acts, and equivalents of all means or step plus function elements in the claims below, if any, are intended to include any structure, material, or act for performing the function in combination with other claimed elements as specifically claimed.

The foregoing description of the embodiments of the invention has been presented for the purpose of illustration and description. It is not intended to be exhaustive and to limit the invention to the precise form disclosed. Modifications or variations are possible in light of the above teaching. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An electrical connecting element comprising:
   a stretchable insulation sheet;
   two or more first conductive threads exposed on one surface of the stretchable insulation sheet, the two or more first conductive threads extending in a predetermined direction and being parallel with each other in a direction orthogonal to the predetermined direction;
   two or more second conductive threads exposed on the other surface of the stretchable insulation sheet, the two or more second conductive threads extending in the predetermined direction and being parallel with each other in a direction orthogonal to the predetermined direction;
   two or more first resin threads exposed on the one surface of the stretchable insulation sheet, the two or more first resin threads having thermal adhesiveness and not overlapping with any of the two or more first conductive threads; and
   two or more second resin threads exposed on the other surface of the stretchable insulation sheet, the two or more second resin threads having thermal adhesiveness and not overlapping with any of the two or more second conductive threads, wherein
   the two or more first conductive threads and the two or more second conductive threads are sewn to the stretchable insulation sheet by a lockstitch and connected to each other,
   the two or more first resin threads and the two or more second resin threads are sewn to the stretchable insulation sheet by a lockstitch and connected to each other,
   the two or more first conductive threads and the two or more first resin threads are alternately disposed on the one surface of the stretchable insulation sheet, and
   the two or more second conductive threads and the two or more second resin threads are alternately disposed on the other surface of the stretchable insulation sheet.

* * * * *